(12) United States Patent
Saino et al.

(10) Patent No.: US 6,614,201 B2
(45) Date of Patent: Sep. 2, 2003

(54) SUBSTRATE TRANSFER SYSTEM

(75) Inventors: Kousaku Saino, Kasaoka (JP); Takahiro Kobiki, Fukuyama (JP)

(73) Assignee: Tazmo Co., Ltd., Okayama (JP)

( * ) Notice: Subject to any disclaimer, the term of this patent is extended or adjusted under 35 U.S.C. 154(b) by 116 days.

(21) Appl. No.: 09/745,777

(22) Filed: Dec. 21, 2000

(65) Prior Publication Data

US 2001/0011876 A1 Aug. 9, 2001

(51) Int. Cl.$^7$ .............................. B25J 9/18; G05B 19/19
(52) U.S. Cl. .............................. 318/568.11; 318/568.21; 414/744.1; 414/226.01; 414/941; 901/30; 901/47
(58) Field of Search ................ 318/568.11, 568.12, 318/568.16, 568.21; 414/744.1–744.8, 935–941, 225.01, 226.01; 901/30, 14–18, 47; 74/490.01

(56) References Cited

U.S. PATENT DOCUMENTS

| | | | |
|---|---|---|---|
| 3,997,065 A | * 12/1976 | Jaksch | .................. 414/936 |
| 5,007,784 A | 4/1991 | Genov et al. | |
| 5,049,029 A | 9/1991 | Mitsui et al. | |
| 5,064,340 A | 11/1991 | Genov et al. | |
| 5,443,354 A | 8/1995 | Stone et al. | |
| 5,525,027 A | 6/1996 | Jinno et al. | |
| 5,534,761 A | 7/1996 | Crippa | |
| 5,640,883 A | 6/1997 | Takizawa | |
| 5,771,748 A | 6/1998 | Genov et al. | |
| 5,775,170 A | 7/1998 | Genov et al. | |
| 5,789,890 A | 8/1998 | Genov et al. | |
| 5,839,322 A | 11/1998 | Genov et al. | |
| 5,857,826 A | 1/1999 | Sato et al. | |
| 6,024,526 A | * 2/2000 | Slocum et al. | ......... 414/226.01 |
| 6,121,743 A | 9/2000 | Genov et al. | |
| 6,161,969 A | * 12/2000 | Kimura et al. | ......... 414/225.01 |
| 6,162,008 A | * 12/2000 | Perkins et al. | ................. 901/47 |
| 6,199,444 B1 | 3/2001 | Wakaizumi et al. | |
| 6,234,738 B1 | * 5/2001 | Kimata et al. | ............... 414/941 |
| 6,326,755 B1 | * 12/2001 | Babbs et al. | ........... 318/568.11 |
| 6,327,517 B1 | * 12/2001 | Sundar | .................. 318/568.21 |
| 6,339,730 B1 | * 1/2002 | Matsushima | ........... 318/568.16 |

FOREIGN PATENT DOCUMENTS

| | | |
|---|---|---|
| JP | 8-274140 | 10/1996 |
| JP | 9-285982 | 11/1997 |

* cited by examiner

Primary Examiner—Robert E. Nappi
Assistant Examiner—Edgardo San Martin
(74) Attorney, Agent, or Firm—Jordan and Hamburg LLP

(57) ABSTRACT

A substrate transfer system comprises plural end-effectors that are placed so as to touch a periphery of a cone having a vertical angle at a $2\theta$ angle with respect to a central axis at an arbitrary $\theta$ angle to a horizontal plane, wherein substrates are interchanged and simultaneously transferred where the end-effectors are in a horizontal position. Besides, since the end-effectors are vertically located, the minimum rotational radius of the system that is projected to a horizontal plane, can be reduced. This contributes toward the reduction of an installation area for a substrate processing equipment in which the substrate transfer system is equipped.

12 Claims, 7 Drawing Sheets

FIG. 5(a) SUBSTRATE DELIVERING POSITION
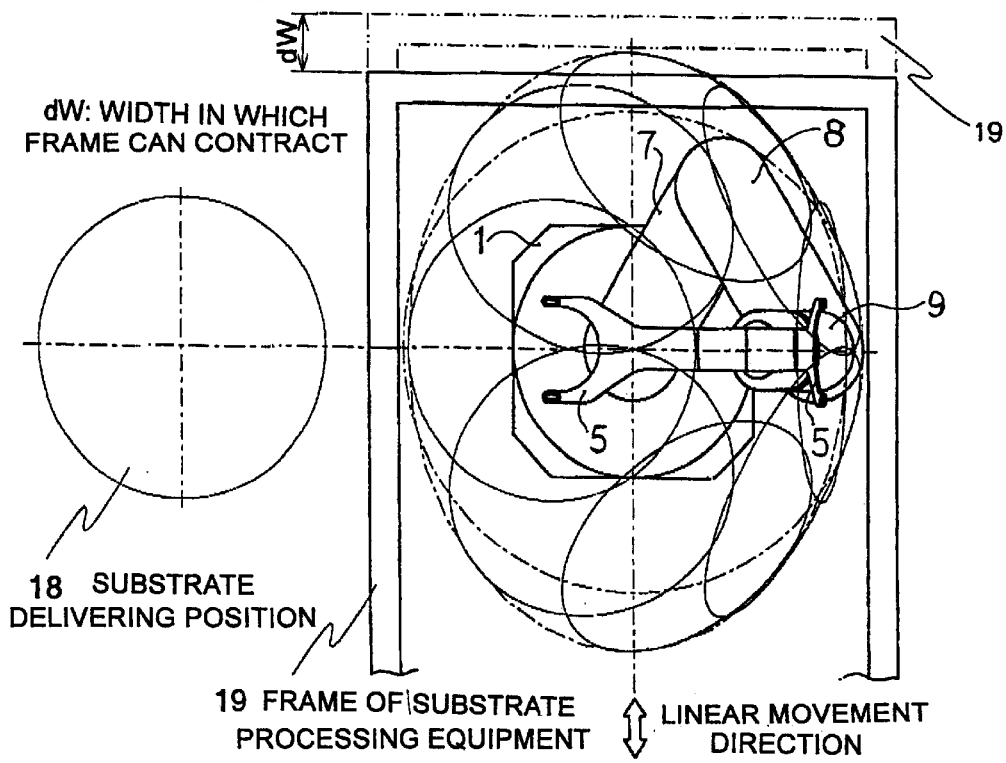
dW: WIDTH IN WHICH FRAME CAN CONTRACT
18 SUBSTRATE DELIVERING POSITION
19 FRAME OF SUBSTRATE PROCESSING EQUIPMENT
LINEAR MOVEMENT DIRECTION
FIG. 5(b) SUBSTRATE INTERCHANGING POSITION
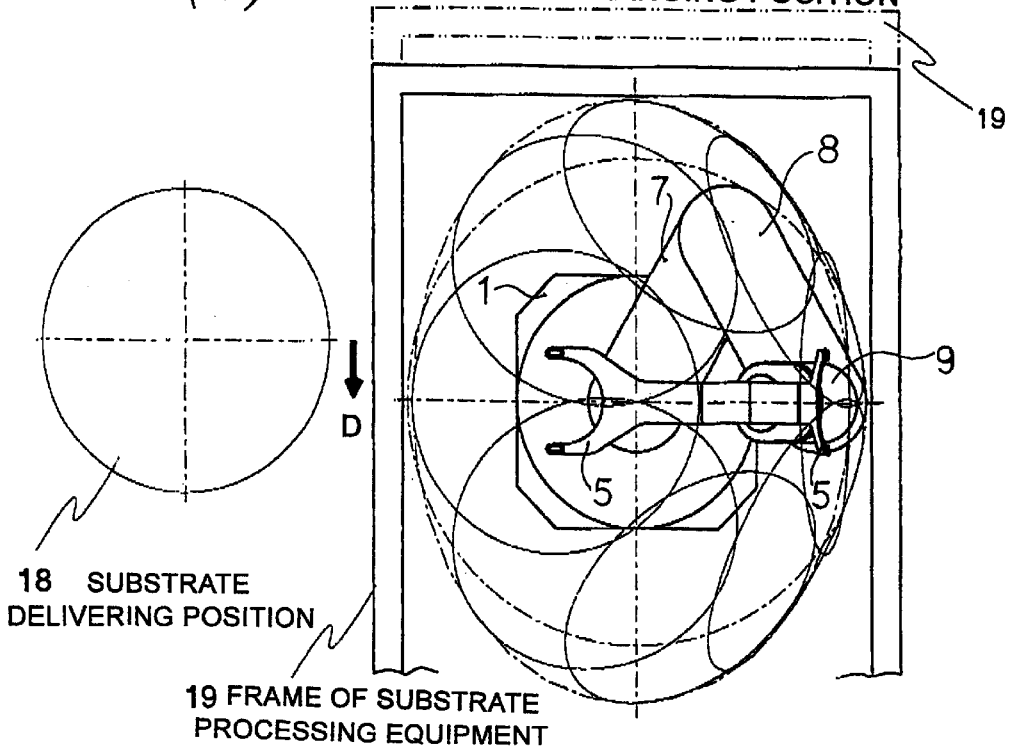
18 SUBSTRATE DELIVERING POSITION
19 FRAME OF SUBSTRATE PROCESSING EQUIPMENT

# SUBSTRATE TRANSFER SYSTEM

BACKGROUND OF THE INVENTION

This invention relates to a substrate transfer system for transferring a substrate such as a silicon (Si) wafer using a robot hand.

As shown in Japanese patent unexamined application publication No. 9-285982, a conventional substrate transfer system for supporting and transferring a plurality of substrates has a structure that at least two end-effectors are located in a surface parallel to a horizontal plane, and positioned in a front and back direction parallel to a transfer direction, and can be rotated about a center position. Employing this kind of structure has made it possible to simultaneously transfer and interchange a plurality of substrates.

FIGS. 6(a) and 6(b) show a substrate transfer system according to a conventional manner. In the substrate transfer system, as described above, an end-effector part 6 which is nearly shaped like H in a surface parallel to a horizontal plane, is structured so as to include a rotational axis in its central position, and connected with a robot hand through the rotational axis such that end-effectors 5 are parallel to a transfer direction. After two substrates are simultaneously set on a forward end-effector 13 in a first step, the end-effector part 6 rotates 180° around the rotational axis that is formed in the central part thereof in a second step, and then, two substrates are simultaneously set on a rearward end-effector 14 in a third step. Thus, the conventional substrate transfer system can simultaneously set and transfer four substrates, thereby largely shortening time for transferring substrates. The minimum rotational radius of the substrate transfer system is a radius of a locus circle 11 around the rotational axis formed in the central part of the end-effector, in which a distal end of the end-effector is inscribed.

A substrate transfer system according to an alternate conventional manner, as shown in FIGS. 7(a) and 7(b), is equipped with two end-effectors 5 and a sensor arm 12 which are spaced at equal angles of 120° in a surface parallel to a horizontal plane, structured so as to include a rotational axis in its central part, and connected with a robot hand through the rotational axis so as to maintain the end-effectors 5 or sensor arm 12 to be parallel to a transfer direction.

In the above substrate transfer system, the substrate is set on the end-effector that is located parallel to a transfer direction in a first step, and after that, the end-effector part 6 rotates 120° around the rotational axis formed in the central part thereof in a second step, then, another substrate is set on another end-effector in a third step. Consequently, the substrate transfer system can simultaneously set and transfer two substrates, and the 120° rotation of the end-effector part 6 faces the sensor arm 12 toward a substrate cassette (in which substrates to be transferred are contained), and driving the sensor arm 12 in an up-and-down direction allows a substrate searching operation and so forth. As in the case of the previously-mentioned substrate transfer system, the minimum rotational radius of this substrate transfer system is also the radius of the locus circle 11 around the rotational axis formed in the central part of the end-effector part, in which the distal end of the end-effector is inscribed.

In recent years, in order to enhance productivity, the need for reducing the installation area (space reduction) has been heightened in a substrate processing equipment in which the substrate transfer system is mounted. For this purpose, an area for the substrate transfer system is also limited in the substrate processing equipment. Thus, there has been an important object that the substrate transfer system achieves required functions in a minimum installation area. Besides, in order to achieve the reduction of overall processing time in a total processing equipment, it is an important element in a development to strive for the elimination of processes that does not directly relate to a substrate transfer process, or reduction of the substrate transfer time.

The above substrate transfer system according to the conventional manner can simultaneously transfer plural substrates, and makes it possible to eliminate processes by a change-over operation for providing one same robot hand with end-effectors and sensor arm, which is an effective means for reducing the overall time for processing. However, providing the end-effectors on which plural substrates or a sensor arm are mounted on a same plane, the conventional substrate transfer system increases its minimum rotational radius, thereby making the installation area of the system itself larger.

SUMMARY OF THE INVENTION

This invention is made to solve the above-mentioned problems. The first object of the present invention is to provide a substrate transfer system comprising plural end-effectors or plural end-effectors and sensor arm, which achieves a smaller rotational radius than that in the case of the conventional system, thereby contributing toward the reduction of an installation area for a substrate processing equipment.

In order to achieve the above-mentioned objects, according to one aspect of the present invention, a substrate transfer system which transfers a substrate such as a silicon wafer by using a robot hand: wherein said robot hand is equipped with at least two end-effectors each having a surface for mounting the substrate; wherein said end-effectors are placed such that said surface for mounting the substrate is along with a periphery of a cone having a vertical angle at 2θ angle with respect to a central axis at arbitrary θ angle to a horizontal plane as axis, and the end-effectors rotate along with the periphery of the cone pivoting on said central axis; and wherein changing over each of end-effectors from one side to another in a horizontal position, interchanges on one same robot hand at least two substrates to be processed, and besides simultaneously transfers at least two substrates.

According to another aspect of the present invention, a substrate transfer system which transfers a substrate such as a silicon wafer by using a robot hand: wherein said robot hand is equipped with at least one end-effector having a surface for mounting the substrate; and wherein said robot hand is further equipped with a sensor arm having an optical sensor device for detecting that a substrate to be transferred is set on an external container of substrate cassettes; wherein said end-effectors and sensor arm are placed such that said surface for mounting the substrate and the optical sensor device are along with a periphery of a cone having a vertical angle at 2θ angle with respect to a central axis at arbitrary θ angle to a horizontal plane, and the end-effectors and sensor arm rotate along with the periphery of the cone pivoting on said central axis; and wherein changing over each of end-effectors and sensor arm in a horizontal position, interchanges substrates on one same robot hand when the robot hand has plural end-effectors, and besides the optical sensor device carries out a substrate searching operation.

BRIEF DESCRIPTION OF THE DRAWINGS

FIGS. 5(a) and 5(b) are plan views showing an example of a layout where the substrate transfer system of the present invention is mounted in a substrate processing equipment, and respectively showing situations that the system is in a substrate delivering position and in a substrate interchanging position in a processing unit.

DETAILED DESCRIPTION OF THE PREFERRED EMBODIMENT OF THE PRESENT INVENTION

Figure 1:
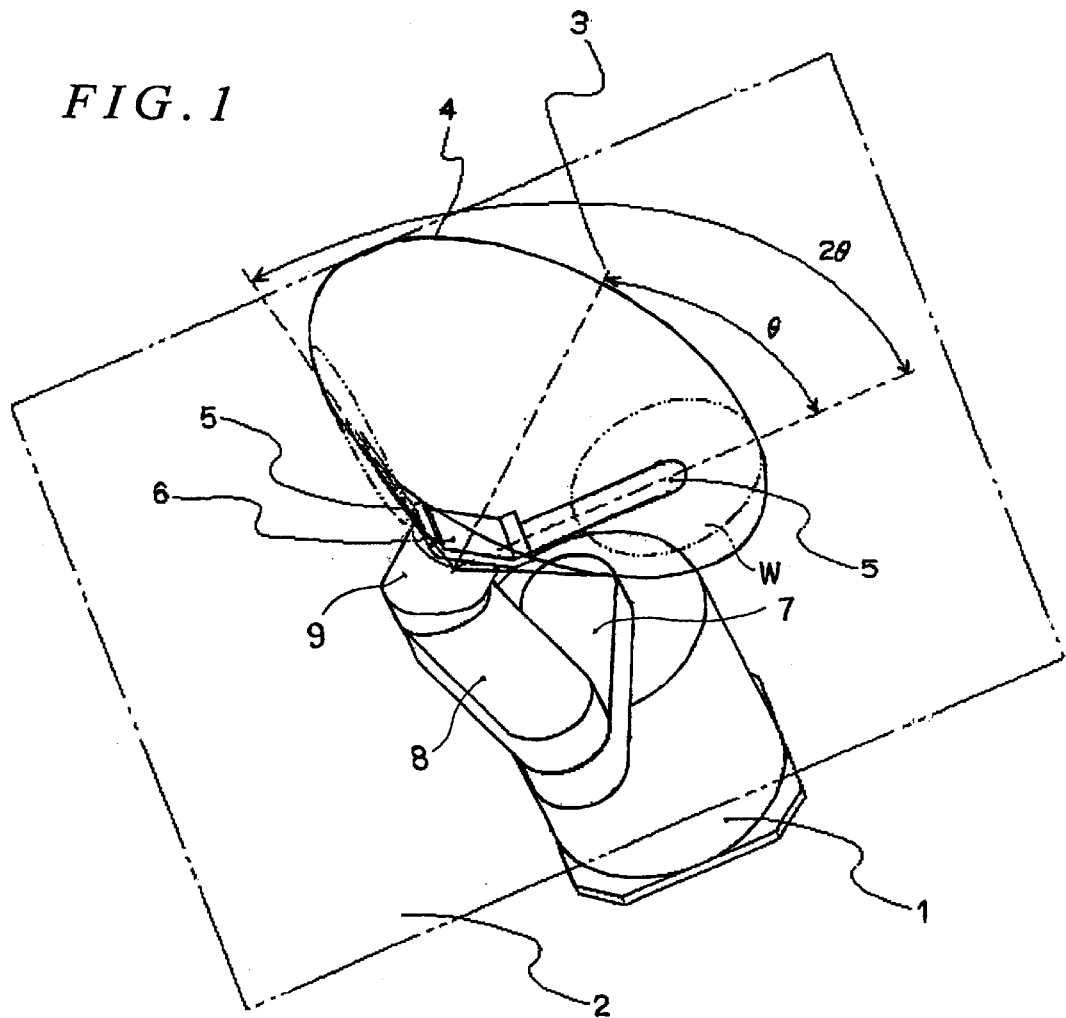
FIG. 1 is a perspective view of a substrate transfer system according to one embodiment of the present invention.

Now, the first embodiment of the present invention will be explained with reference to the drawings. In FIG. 1, a substrate transfer system is equipped with a robot hand that is rotatably mounted on a base 1 which contains a driving system and so forth. Further, the substrate transfer system is equipped in a distal end side with at least two end-effectors 5 each surface for mounting the substrate has a substrate supporting surface. The robot hand includes a first arm 7 and a second arm 8 that are linked with each other. Each of the end-effectors 5 is mounted to the end-effector part 6 at a predetermined angle. The end-effector part 6 is supported rotatably on a slope formed in a rotatable head 9 that is rotatably set on a distal end portion of the second arm 8.

In the above-mentioned condition, the end-effector part 6 is rotatably set pivoting on an axis 3 which is at an angle of θ to a horizontal plane 2, and each of the end-effectors 5 is placed such that the substrate supporting surface circumscribes or is along with a cone (virtual) periphery 4 having a vertical angle 2θ when the end-effectors are rotated by rotation of the end-effector part 6. In the present embodiment, each of the end-effectors 5 is placed to be symmetrical with respect to the axis on the cone periphery 4.

As to the above plural end-effectors 5, the end-effector part 6 rotates pivoting on the cone axis 3, which changes over the end-effector positions from one to another in a horizontal position. Therefore, this makes it possible to interchange on the same robot hand at least two substrates to be processed. Besides, plural substrates can simultaneously be transferred at the same time. The base 1 contains the driving system (not shown in the figures) which rotates the arms and rotational head 9 pivoting on each of the rotational axes so as to allow the rotational head 9 to move in a straight line in the plane.

Figure 2A:
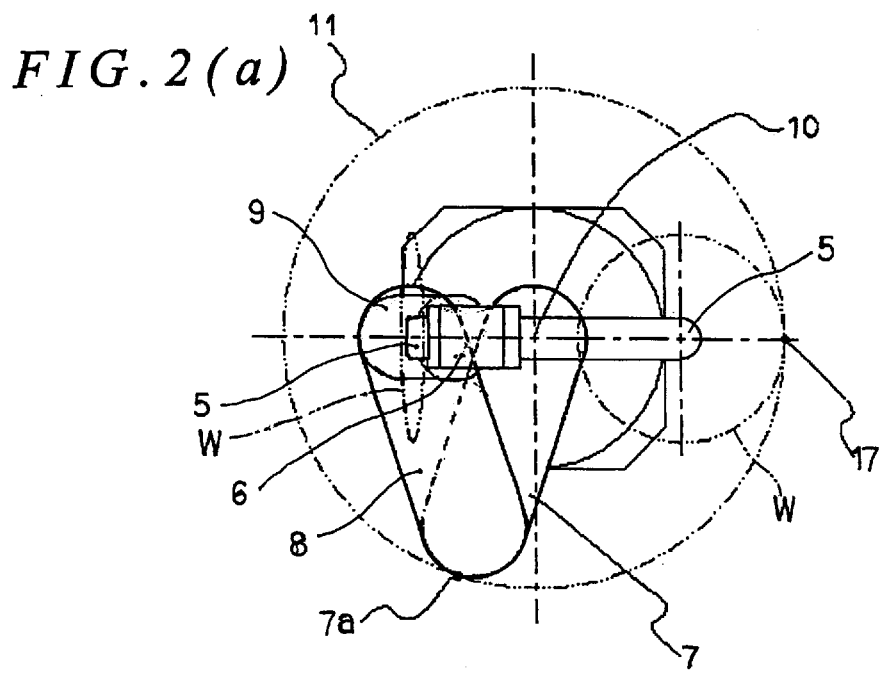
FIGS. 2(a) and 2(b) are respectively a plan view and a side view of said substrate transfer system.
Figure 2B:
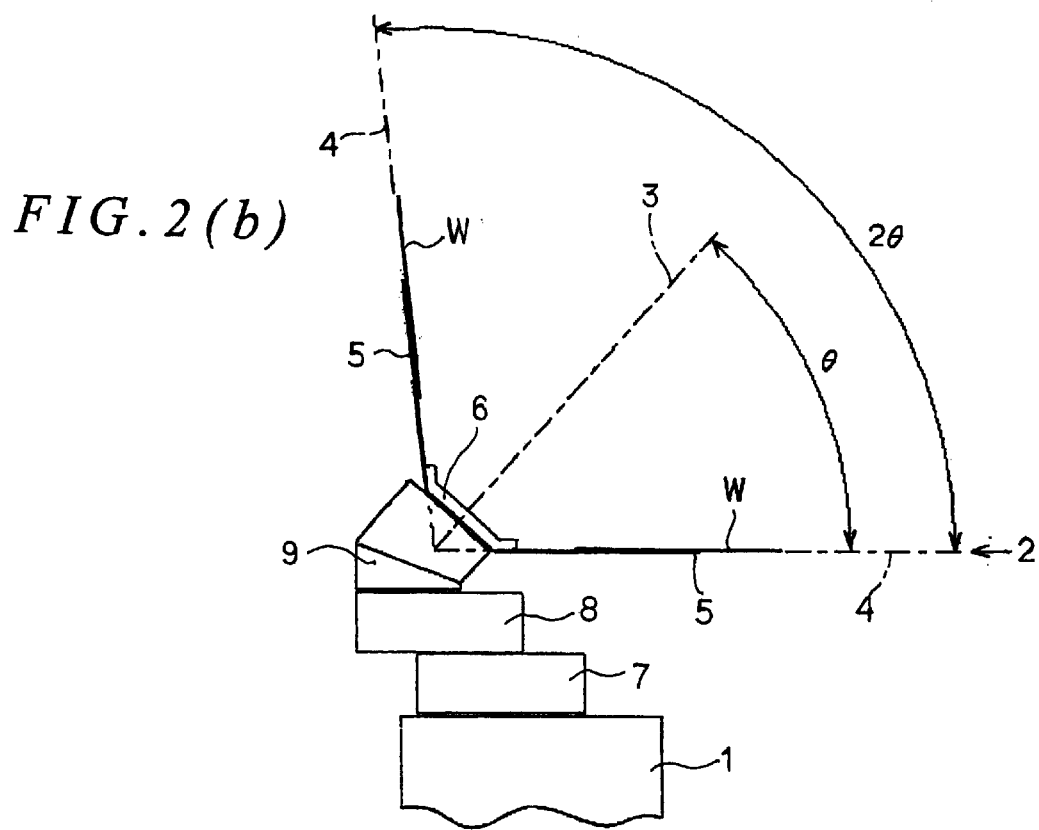

FIGS. 2(a) and 2(b) show a state of the substrate transfer system in the minimum rotational radius. As to the minimum rotational radius of the substrate transfer system according to the present invention, a distal end 17 of a substrate W that is mounted on the horizontally-placed end-effector 5, or a distal end 7a of the first arm 7 is inscribed in it, and the minimum rotational radius becomes a radius of a locus circle 11 (locus projected on a horizontal plane) around a rotational axis 10 of the first arm 7. In this condition, the minimum rotational radius is not influenced by another end-effector that is spatially placed or an end-effector on which a substrate is mounted. In the present invention, the substrate transfer system employs the first arm 7 and second arm 8 that are equal in length with each other, and when the first and second arms contract at a predetermined angle, the distal end 17 of the substrate W and distal end 7a of the first arm 7 can be inscribed in the locus circle 11.

Figure 3:
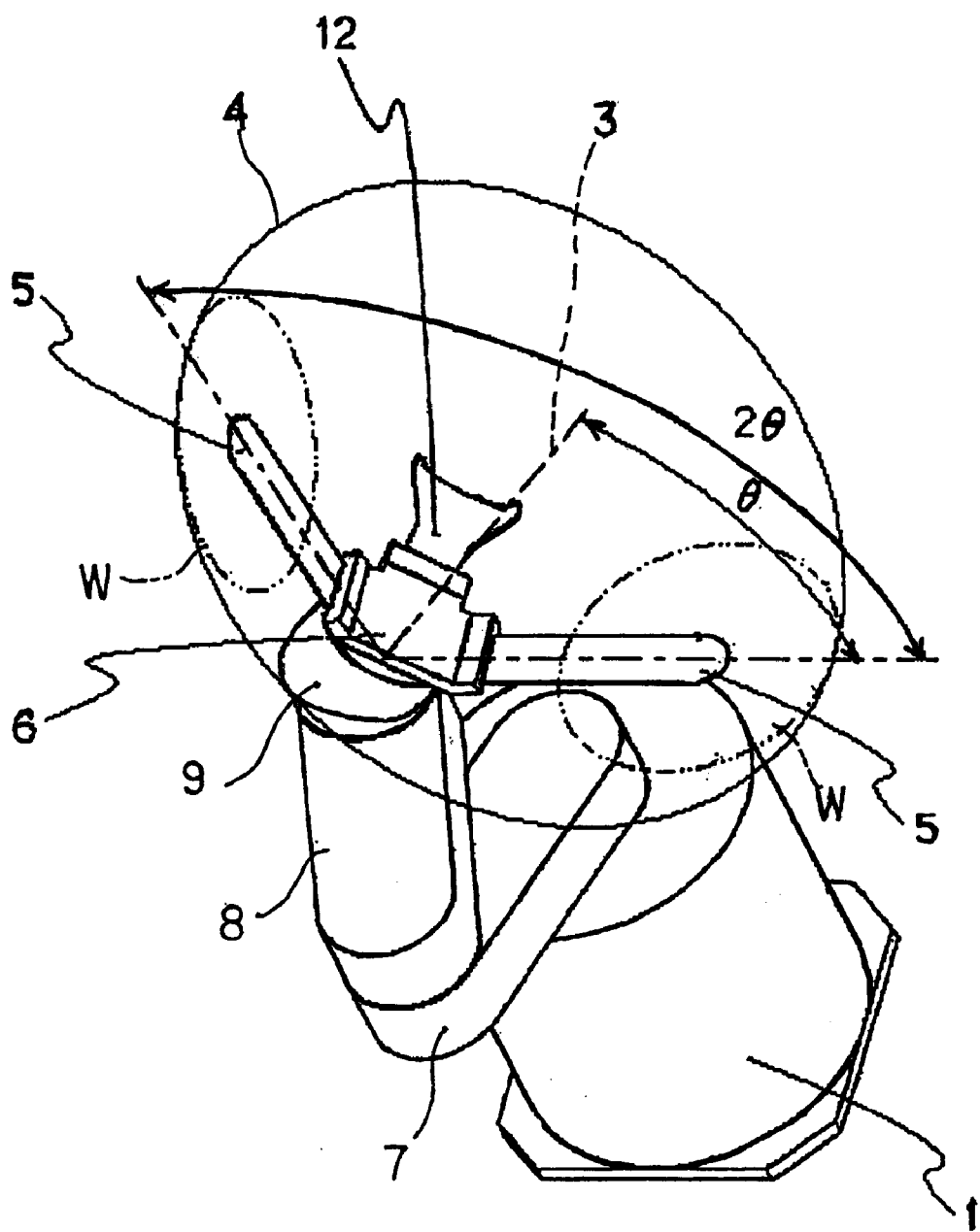
FIG. 3 is a perspective view of a substrate transfer system according to an alternate embodiment of the present invention.

Next, an alternate embodiment of the present invention is shown in FIG. 3. The substrate transfer system in this embodiment is equipped with one or more end-effectors 5 (two in the present embodiment) and a sensor arm 12 having a penetrative optical sensor on its distal end portion so as to circumscribe or touch a periphery of a cone (virtual) having a vertical angle of 2θ with respect to a central axis which is at θ angle to a horizontal plane. The end-effector 5 and sensor arm 12 are mounted in the end-effector part 6 which rotates pivoting on the cone central axis 3. The rotation of the end-effector part 6 makes it possible to change over functions for transferring and searching substrates on the same robot hand.

The optical sensor is a device for detecting that a substrate to be transferred by the substrate transfer system of the present invention is set on a substrate cassette (container, not shown in the figures). The structure of the present invention can simultaneously transfer or search the plural substrates W by changing over each of the end-effector 5 or sensor arm 12 in a horizontal position.

In the present embodiment, a length of the sensor arm 12 is designed such that, when the end-effector part 6 rotates, a radius of the locus circle taken by the distal end of the sensor arm 12 becomes smaller than a radius of the locus circle taken by the distal end of the end-effector 5 on which the substrate W is mounted. In this embodiment, just as in the case of the previously-described embodiment, as to the minimum rotational radius of the substrate transfer system according to the present invention, a distal end of a substrate W that is mounted on the horizontally-placed end-effector 5, or a distal end of the first arm 7 is inscribed in it, and the minimum rotational radius becomes a radius of a locus circle (locus projected on a horizontal plane) around a rotational axis of the first arm 7. In this condition, the minimum rotational radius is not influenced by another end-effector, the vertically-placed end-effector that supports the substrate, or a sensor arm.

In the case that two end-effectors face to each other at an angle of 2θ, and circumscribe the same cone periphery in the substrate transfer system of the present invention, in order for the present invention to effectively perform its functions, it is desired that the vertical angle 2θ of the cone is in an effective range which limits the maximum value calculated by later-mentioned equation.

Figure 4A:
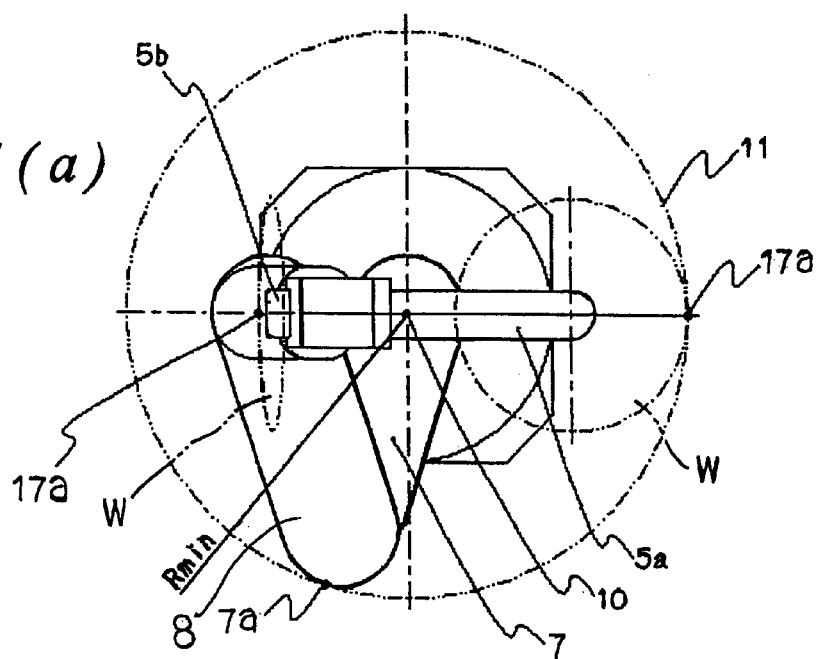
FIGS. 4(a) and 4(b) are respectively a plan view and a side view explaining a range of a vertical angle of a cone for which the present invention is effective.
Figure 4B:
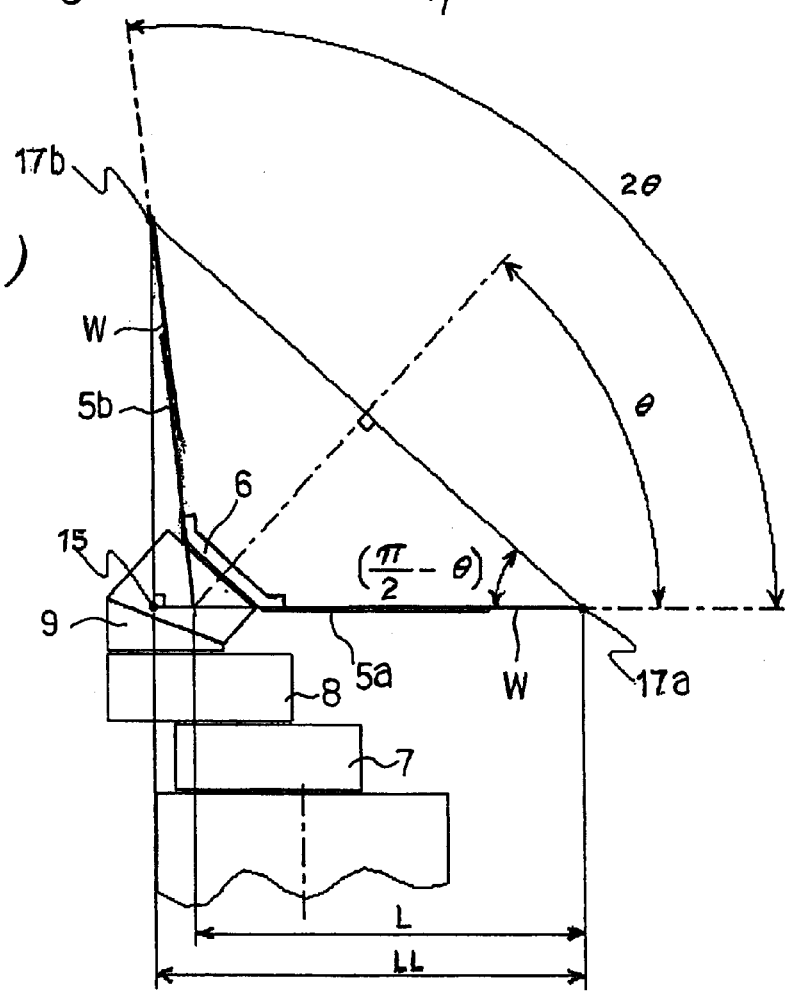
Figure 6A:
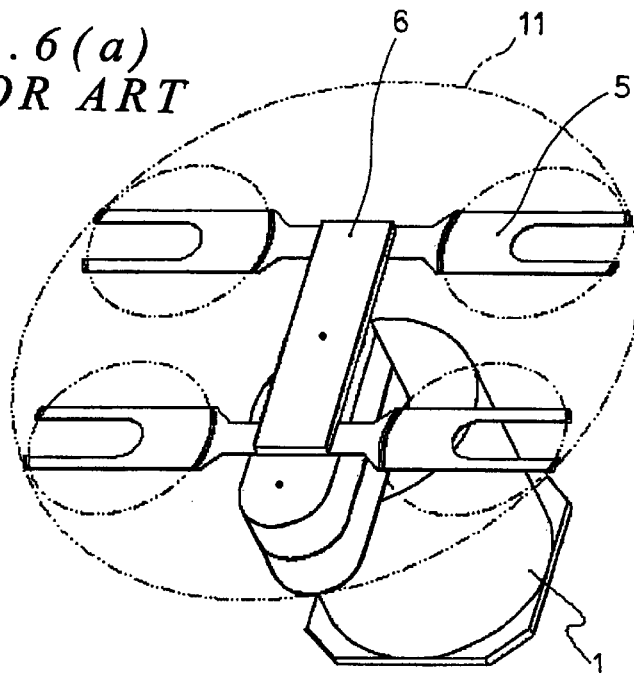
FIGS. 6(a) and 6(b) are respectively a perspective view and a plan view of a substrate transfer system according to a conventional manner.
Figure 6B:
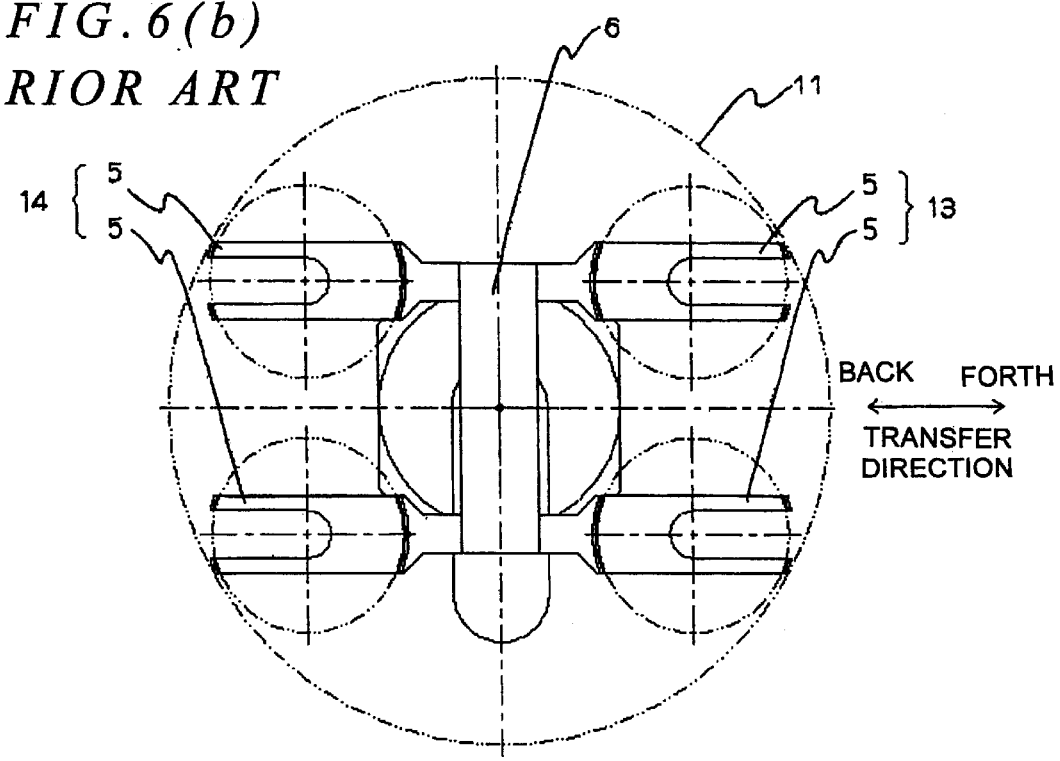
Figure 7A:
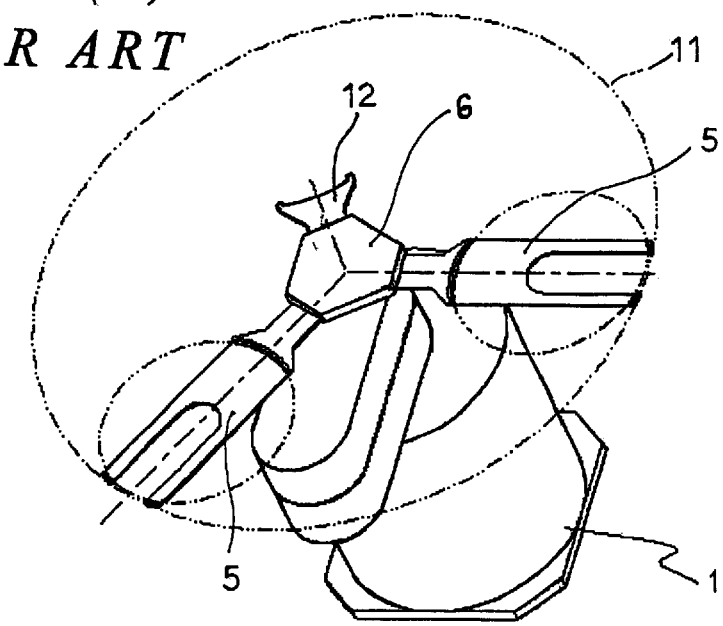
FIGS. 7(a) and 7(b) are respectively a perspective view and a plan view of a substrate transfer system according to an alternate conventional manner.
Figure 7B:
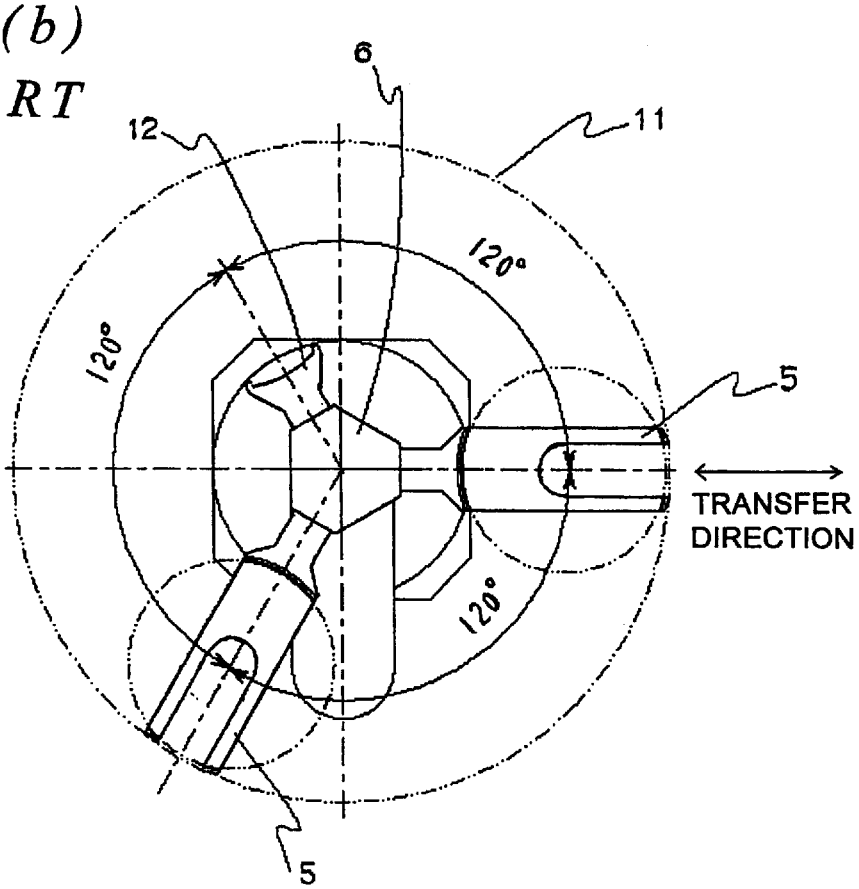

This is explained referring to FIGS. 4(a) and 4(b). In FIGS. 4(a) and 4(b) (equal to the structure of FIGS. 2(a) and 2(b)), as to the minimum rotational radius of the substrate transfer system according to the present invention, the distal end 17a of a substrate W that is mounted on the horizontally-placed end-effector 5a, or the distal end 7a of the first arm 7 is inscribed in it, and the minimum rotational radius becomes a radius Rmin of the locus circle 11 (locus projected on a horizontal plane) around the rotational axis 10 of the first arm 7. When a perpendicular line is drawn to a horizontal plane from a distal end 17b of the substrate W mounted on a vertically-placed end-effector 5b, a length LL between a line segment from an intersecting point 15 of the perpendicular line, and the distal end 17a of the horizontally-mounted substrate W should be within a range of a diameter (2·Rmin) of the locus circle 11. That is, when the line segment LL is equal to the diameter of the locus circle 11, the vertical angle 2θ of the cone is the upper limit value.

$$2R\text{min}=LL$$

$$2R\text{min}=2L\sin\theta\cdot\cos(\pi/2-\theta)$$

$$\therefore 2\theta=2\sin^{-1}\sqrt{R\text{min}/L} \quad [\text{Equation 1}]$$

Here, it is assumed that:
  Rmin: minimum rotational radius
  L: length of a bus of the cone (const.: constant value that is determined by the length of the end-effector)

The above vertical angle 2θ of the cone is the upper limit value within the effective range in the present invention. In this condition, the locus circle taken by the distal end of the substrate W mounted on the spatially-placed end-effectors 5a and 5b is projected onto the horizontal plane as an ellipse which is inscribed in the locus circle 11 taken by the minimum rotational radius in a horizontal plane, which achieves a smaller rotational radius than that in the conventional manner.

Further, if the end-effector is placed beyond the above upper limit, the distal end 17b of the spatially-placed substrate W is positioned at the outside of the locus circle 11 that determines the minimum rotational radius, which causes an undesirable result of preventing decrease of the minimum rotational radius.

Furthermore, referring to FIGS. 5(a) and 5(b), the explanation is given to operations of delivering and interchanging substrates by the substrate transfer system according to the present invention in a processing unit of the substrate processing equipment. FIG. 5(a) shows a situation that the system is in a substrate delivering position, and FIG. 5(b) shows a position that the system is in a substrate interchanging position. In the case that the base 1 of the substrate transfer system is provided on a driving unit which can move in a linear direction (shown by an open arrow) on a horizontal plane, and the driving unit is laid out in the substrate processing equipment, in order to carry out the substrate interchanging and delivering operation in the processing unit which is located in an endpoint of the linear movement section, a frame 19 of the substrate processing equipment in which the substrate transfer system is equipped, is structured so as not to interfere the locus taken by the distal end of the substrate mounted on the end-effector in the substrate interchanging operation as shown by a phantom line. In the operation for delivering the substrates, the end-effector, as shown in FIG. 5(a), linearly moves to a position 18 for delivering the substrate in the substrate processing equipment.

Compared with it, prior to the operation for interchanging the substrates, as shown in FIG. 5(b) from FIG. 5(a), the substrate transfer system is moved linearly backward and then, interchanges the substrates (shown by an arrow D), thereby the frame 19 can be decreased in length by dW without interfering said locus (shown by a solid line).

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims. For example, although the above-embodiment shows the substrate transfer system having two end-effectors, the transfer system having three or more end-effectors can also be applied.

What is claimed is:

1. A substrate transfer system which transfers a substrate, comprising:
   a robot hand equipped with at least two end-effectors each having a surface for mounting the substrate;
   said end-effectors being placed such that said surface for mounting the substrate is along with a periphery of a cone having a vertical angle at 2θ angle with respect to a central axis which is at an arbitrary θ angle to a horizontal plane, and the end-effectors rotate along with the periphery of the cone pivoting on said central axis; and
   wherein changing over each of said end-effectors from one side to another in a horizontal position, interchanges on one same robot hand at least two substrates to be processed, and thereby allows simultaneous transfer of said at least two substrates.

2. The substrate transfer system according to claim 1, wherein the robot hand is rotatably provided on a base, and includes first and second arms which are linked with each other, and wherein the end-effector is rotatably supported on a slope formed in a rotational head which is rotatably provided on a distal end of the second arm.

3. The substrate transfer system according to claim 1, wherein at least two of said at least two end-effectors are placed in a symmetrical position with respect to an axis on the periphery of the cone.

4. The substrate transfer system according to claim 2, wherein, when a radius of a locus circle around the rotational axis of the first arm is Rmin, and a bus of the cone is L, L being a constant determined by a length of the end effector, a vertical angle of the cone $2\theta=2\sin^{-1}\sqrt{R\text{min}/L}$ becomes an upper limit value in an effective range.

5. The substrate transfer system according to claim 4, wherein a locus circle taken by the distal end of the substrate mounted on the spatially-placed end-effector is projected as an ellipse inscribing a locus circle of a minimum rotational radius on a horizontal plane.

6. A substrate transfer system which transfers a substrate, comprising:
   a robot hand equipped with at least one end-effector having a surface for mounting the substrate; and
   said robot hand being further equipped with a sensor arm having an optical sensor device for detecting that a substrate to be transferred is set on an external container of substrate cassettes;
   said at least one end-effector and said sensor arm being placed such that said surface for mounting the substrate and the optical sensor device are along with a periphery of a cone having a vertical angle at 2θ angle with respect to a central axis at an arbitrary θ angle to a horizontal plane, and the at least one end-effector and the sensor arm rotate along with the periphery of the cone pivoting on said central axis; and
   wherein the optical sensor device carries out a substrate searching operation by changing over each of the at least one end-effector and the sensor arm in a horizontal position.

7. The substrate transfer system according to claim 6, wherein said at least one end-effector includes end-effectors, and changing over each of said end-effectors and said sensor arm in a horizontal position interchanges and simultaneously transfers at least two substrates on one same robot hand.

8. A substrate transfer system which transfers a substrate, comprising:

a robot hand equipped with at least two end-effectors, the end-effectors being capable of rotation, for a change-over operation, along with a periphery of a cone having a generatrix coinciding with a horizontal plane; and said system being installed in a substrate processing equipment and provided on a driving unit for moving a base in a linear direction on a horizontal plane between a substrate delivering position, in which an interference is present between the robot hand and structure of the substrate processing equipment when the end-effectors are rotated, and a substrate interchanging position, in which said interference is relieved thereby allowing rotation of the end-effectors to carry out the end-effector change-over operation.

9. A robot hand of a substrate transfer system which transfers a substrate, comprising:

at least two end-effectors each including a surface for mounting the substrate, said end-effectors being rotatably mounted to support structure for rotation about a rotational axis which is arranged at an arbitrary angle relative to a horizontal plane, said end-effectors being oriented with respect to said rotational axis such that when said at least two end-effectors are rotated, said surface for mounting follows along a virtual cone having an apex through which the rotational axis passes, a side of said virtual cone being arranged along the horizontal plane, such that each said surface for mounting can be alternately brought into a horizontal condition by rotation of said at least two end-effectors about said rotational axis.

10. The robot hand according to claim 9, further comprising:

first and second arms which are linked with each other; and a rotational head which is rotatably provided on a distal end of the second arm, said at least two end-effectors being supported on a slope formed in said rotational head.

11. The robot hand according to claim 10, wherein said robot hand is mounted to a base.

12. The robot hand according to claim 9, wherein at least a portion of said at least two end-effectors are arranged on the virtual cone to be symmetrical with respect to the rotational axis.

* * * * *

UNITED STATES PATENT AND TRADEMARK OFFICE
CERTIFICATE OF CORRECTION

PATENT NO.    : 6,614,201 B2                                            Page 1 of 1
DATED         : September 2, 2003
INVENTOR(S)   : Kousaku Saino et al.

It is certified that error appears in the above-identified patent and that said Letters Patent is hereby corrected as shown below:

<u>Title page,</u>
Insert item -- [30]    Foreign Application Priority Data
                       February 7, 2000……………………….. 2000-028535 --

Signed and Sealed this

Sixth Day of April, 2004

JON W. DUDAS
*Acting Director of the United States Patent and Trademark Office*